(12) United States Patent
Seo et al.

(10) Patent No.: US 12,538,682 B2
(45) Date of Patent: Jan. 27, 2026

(54) DISPLAY PANEL AND DISPLAY DEVICE (71) Applicant: LG Display Co., Ltd., Seoul (KR)

(72) Inventors: Jeong Rim Seo, Paju-si (KR); Soo Hong Choi, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 552 days.

(21) Appl. No.: 17/977,211

(22) Filed: Oct. 31, 2022

(65) Prior Publication Data

US 2023/0217759 A1 Jul. 6, 2023

(30) Foreign Application Priority Data

Dec. 31, 2021 (KR) .................. 10-2021-0194602

(51) Int. Cl.
*G09G 3/3233* (2016.01)
*H10K 59/124* (2023.01)
*H10K 59/126* (2023.01)
*H10K 59/131* (2023.01)

(52) U.S. Cl.
CPC ....... *H10K 59/1315* (2023.02); *G09G 3/3233* (2013.01); *H10K 59/124* (2023.02); *H10K 59/126* (2023.02); *G09G 2300/0426* (2013.01); *G09G 2300/0842* (2013.01)

(58) Field of Classification Search
CPC ... G09G 2310/08; H10D 86/441; H10D 86/60
See application file for complete search history.

(56) References Cited

U.S. PATENT DOCUMENTS

| 11,049,436 | B1* | 6/2021 | Shin | ................ | G09G 3/2092 |
| 2020/0411629 | A1* | 12/2020 | Kim | ................ | H10K 59/131 |
| 2022/0190090 | A1* | 6/2022 | Dai | ................ | H10K 59/131 |

FOREIGN PATENT DOCUMENTS

| KR | 10-2009-0072548 A | 7/2009 |
| KR | 10-2015-0078248 A | 7/2015 |

* cited by examiner

*Primary Examiner* — Kevin M Nguyen
(74) *Attorney, Agent, or Firm* — Birch, Stewart, Kolasch & Birch, LLP (57) ABSTRACT

A gate-in-panel (GIP) display panel and a device are discussed, which are capable of resolving an output deviation between shift clock lines disposed in a bezel area and easily achieving a narrow bezel. The display panel can include an active area configured to display an image, and a bezel area disposed around the active area. Further, a ground area, a clock line area, a GIP circuit area, and a low-voltage line area can be disposed in the bezel area, and the clock line area can be disposed closest to the active area.

12 Claims, 6 Drawing Sheets

DISPLAY PANEL AND DISPLAY DEVICE

CROSS-REFERENCE TO RELATED APPLICATIONS

This application claims priority to Korean Patent Application No. 10-2021-0194602, filed in the Republic of Korea on Dec. 31, 2021, the entire contents of which are hereby expressly incorporated by reference into the present application.

BACKGROUND OF THE INVENTION

Field of the Invention

The present invention relates to a display panel and a display device including the display panel.

Discussion of the Related Art

In the information society, various technologies have been developed in the field of display devices for displaying visual information as an image or video. Among display devices, an electroluminescent display device is in the spotlight.

The electroluminescent display device can be roughly classified into an inorganic light-emitting display device and an organic light-emitting display device according to the material of an emission layer.

An active matrix type organic light-emitting display device includes a light-emitting element that emits light by itself, and has advantages of a fast response speed and high luminous efficacy, luminance, and viewing angle. The light-emitting element can be an organic light-emitting diode (hereinafter referred to as "OLED"). The organic light-emitting display device can express a black gradation as complete black, and thus can reproduce an image at a superior level in contrast ratio and color gamut.

The organic light-emitting display device includes an organic light-emitting display panel in which circuit elements of a pixel array are disposed, and a driving circuit for driving the organic light-emitting display panel.

The pixel array of the organic light-emitting display panel includes a plurality of gate lines and a plurality of data lines arranged in directions perpendicular to each other, and pixels defined in cross areas of the respective gate lines and data lines.

Each pixel includes an OLED and a pixel driving circuit for driving the OLED by supplying a current to the OLED according to a gate-source voltage. The OLED includes an anode and a cathode, and an organic compound layer formed between these electrodes. The organic compound layer includes a hole injection layer HIL, a hole transport layer HTL, an emission layer EML, an electron transport layer ETL, and an electron injection layer EIL. When a current flows through the OLED, holes passing through the hole transport layer HTL and electrons passing through the electron transport layer ETL move to the emission layer EML to form excitons, and as a result, the emission layer EML generates visible light.

The driving circuit reproduces an input image on the pixel array by writing pixel data of the input image to the pixels. The driving circuit includes a data driving circuit for supplying a pixel data signal to each data line, a gate driving circuit for sequentially supplying a gate signal to each of the gate lines, a timing controller for controlling operation timings of the data driving circuit and the gate driving circuit, etc. The timing controller can control operation timings of the data driving circuit and the gate driving circuit.

The gate driving circuit can be directly formed on the organic light-emitting display panel together with circuit elements of the pixel array included in a screen.

Each of the circuit elements of the pixel array and the gate driving circuit includes a plurality of transistors. Hereinafter, the gate driving circuit directly formed on a substrate of the display panel together with the circuit elements of the pixel array will be referred to as a "gate-in-panel (GIP) circuit".

SUMMARY OF THE INVENTION

Accordingly, the present invention is directed to a display panel and a display device that substantially obviates one or more problems due to limitations and disadvantages of the related art.

An object of the present invention is to provide a GIP display panel and a display device capable of resolving an output deviation between shift clock lines disposed in a bezel area and easily achieving a narrow bezel.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, a display panel includes an active area; and a bezel area disposed around the active area, and wherein a ground area, a clock line area, a GIP circuit area, and a low-voltage line area disposed in the bezel area, and wherein the clock line area is disposed closest to the active area.

The ground area, the gate-in-panel circuit area, the low-voltage line area, and the clock line area can be sequentially disposed in a direction from an edge of the display panel to the active area.

The active area can include a first metal pattern disposed on a substrate to block light, a buffer layer disposed on the substrate to cover the first metal pattern, a thin film transistor (TFT) and a capacitor disposed on the buffer layer, a protective layer and a planarization layer disposed on the substrate to cover the thin film transistor and the capacitor, and a light-emitting element disposed on the planarization layer, the light-emitting element including an anode, an organic compound layer, and a cathode, the cathode can extend to a predetermined area of the bezel area, and all shift clock signal lines disposed in the clock line area can overlap the cathode.

A ground line disposed in the ground area, the shift clock signal lines, and a low-voltage supply line disposed in the low-voltage line area can be disposed on the same layer as a layer of the first metal pattern.

The ground line disposed in the ground area, the shift clock signal lines, and the low-voltage supply line disposed in the low-voltage line area can be formed as a double metal structure in which the first metal pattern and a material of a gate electrode of the thin film transistor are stacked.

The gate-in-panel circuit area can be disposed on the same layer as a layer of the thin film transistor and the capacitor.

A display device includes the display panel and a display panel driving circuit for driving the display panel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

The advantages and features of the present invention, and the method for achieving the advantages and features will become apparent with reference to embodiments described below in detail in conjunction with the accompanying drawings. However, the present invention is not limited to the embodiments disclosed below and can be implemented in a variety of different forms, and these embodiments allow the disclosure of the present invention to be complete and are merely provided to fully inform those of ordinary skill in the art to which the present invention belongs of the scope of the invention. Further, the invention is merely defined by the scope of the claims.

The shapes, sizes, proportions, angles, numbers, etc. disclosed in the drawings for describing the embodiments of the present invention are illustrative, and thus the present invention is not limited to the illustrated elements. The same reference symbols refer to the same elements throughout the specification. In addition, in describing the present invention, when it is determined that a detailed description of a related known technology can unnecessarily obscure the subject matter of the present invention, such a detailed description will be omitted.

When "equipped with", "including", "having", "consisting", etc. are used in this specification, other parts can also be present, unless "only" is used. When an element is expressed in the singular, the element can be interpreted as being plural unless explicitly stated otherwise.

In interpreting an element, it is to be interpreted as including an error range even when there is no separate explicit description thereof.

In the case of a description of a positional relationship, for example, when a positional relationship between two parts is described using "on", "above", "below", "next to", etc., one or more other parts can be located between the two parts, unless "immediately" or "directly" is used.

Although "first", "second", etc. can be used to distinguish between elements, functions or structures of these elements are not limited by the ordinal numbers attached in front of the elements or names of the elements. Since the claims are described based on elements, the ordinal numbers attached in front of the names of the elements in the claims may not match the ordinal numbers attached in front of the names of the elements in the embodiments.

The following embodiments can be partially or wholly united or combined with each other, and various types of interlocking and driving are technically possible. The respective embodiments can be implemented independently of each other, or can be implemented together in an interrelated relationship.

In one or more embodiments of the present invention, each of a GIP circuit of a gate driving circuit and a pixel circuit includes a plurality of transistors. A transistor can be implemented as a thin film transistor (TFT) of a metal-oxide-semiconductor FET (MOSFET) structure, and can be an oxide TFT including an oxide semiconductor or an LTPS TFT including low temperature polysilicon (LTPS). The oxide TFT can be implemented as an n-type TFT (NMOS), and the LTPS TFT can be implemented as a p-type TFT (PMOS). In each of the GIP circuit of the gate driving circuit and the pixel circuit, both the n-type TFT (NMOS) and the p-type TFT (PMOS) can be formed.

A MOSFET is a three-electrode device including a gate, a source, and a drain. The source is an electrode that supplies carriers to the transistor. In the MOSFET, carriers flowing from the source. The drain is an electrode through which carriers exit the MOSFET. In the MOSFET, carriers flow from the source to the drain. In the case of the n-type TFT (NMOS), since carriers are electrons, a source voltage is lower than a drain voltage so that electrons can flow from the source to the drain. In the n-type TFT (NMOS), current flows in a direction from the drain to the source. In the case of the p-type TFT (PMOS), since carriers are holes, a source voltage is higher than a drain voltage so that holes can flow from the source to the drain. In the p-type TFT (PMOS), since holes flow from the source to the drain, current flows from the source to the drain. It should be noted that the source and drain of the TFT are not fixed. For example, the source and drain can be changed according to an applied voltage. Therefore, the invention is not limited by the source and drain of the TFT. In the following description, the source and the drain of the TFT will be referred to as first and second electrodes, respectively.

A scan pulse (gate signal) output from a GIP circuit of the gate driving circuit swings between a gate-on voltage and a gate-off voltage. The gate-on voltage is set to a voltage higher than a threshold voltage of the TFT, and the gate-off voltage is set to a voltage lower than the threshold voltage of the TFT. The TFT is turned on in response to the gate-on voltage, while turned-off in response to the gate-off voltage.

Hereinafter, various embodiments of the present specification will be described in detail with reference to the accompanying drawings.

In the following embodiments, an electroluminescent display will be mainly described with respect to an organic light-emitting diode display including an organic light-emitting material. It should be noted that the technical concept of the present specification is not limited to the organic light-emitting diode display. For example, the present invention is applicable to a gate driving circuit of a digital flat panel display that requires a gate driving circuit, for example, a liquid crystal display (LCD) or a quantum dot display (QD), without significant change. Further, all components of each display device according to all embodiments of the present invention are operatively coupled and configured.

Figure 1:
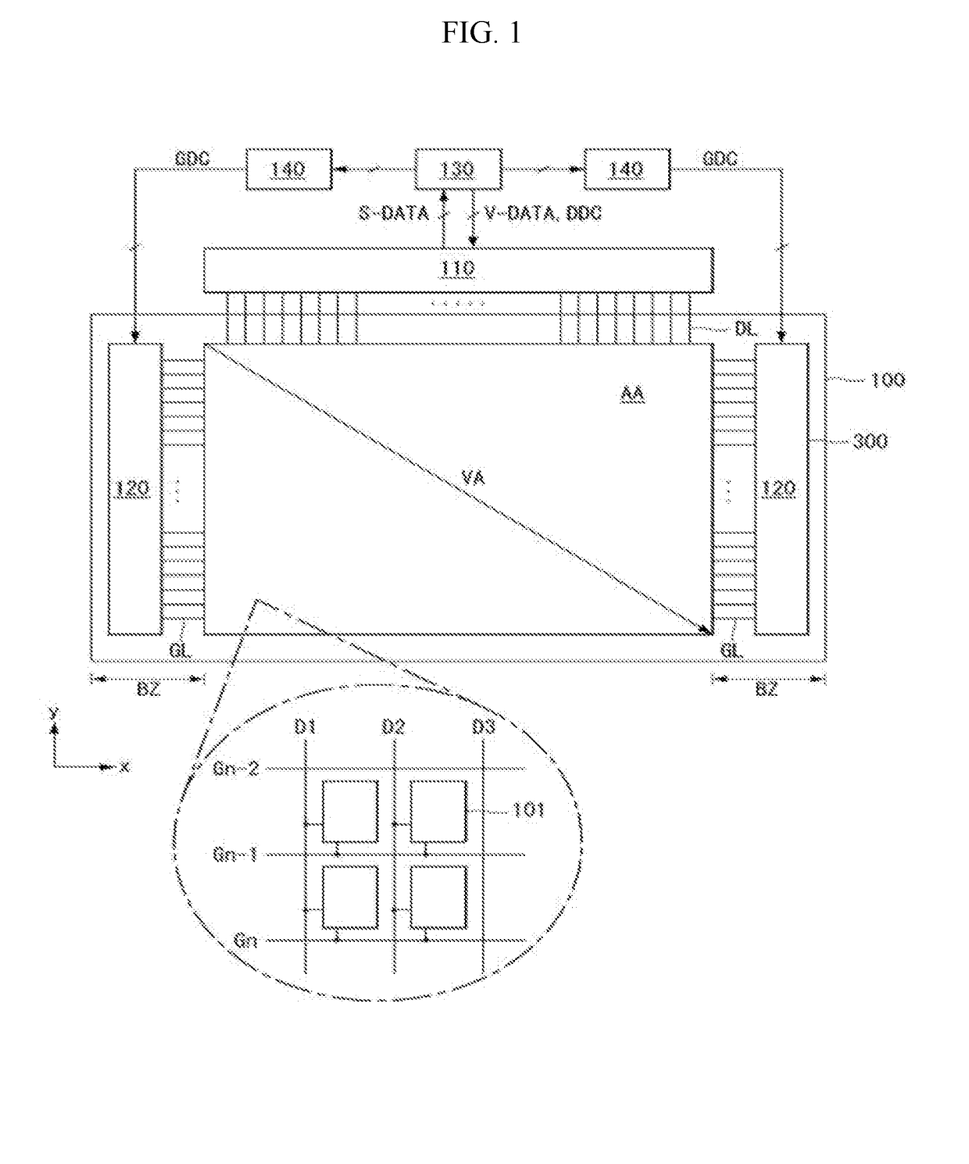
FIG. 1 is a configuration diagram of a display device according to an embodiment of the present invention.

FIG. 1 is a configuration diagram of a display device according to an embodiment of the present invention.

Referring to FIG. 1, the display device according to the embodiment of the present specification includes a display panel 100 and a display panel driving circuit.

The display panel 100 includes an active area AA that displays data of an input image. The active area AA is a screen on which video data of an input image is displayed. A pixel array of the active area AA includes a plurality of data lines DL, a plurality of gate lines GL intersecting the data lines DL, and pixels arranged in a matrix. In addition to the matrix, the pixels can be arranged in various forms, such as a form in which pixels emitting the same color are shared, a stripe form, and a diamond form.

Each of the pixels can be divided into a red subpixel, a green subpixel, and a blue subpixel to implement color. Each of the pixels can further include a white subpixel. Each of the subpixels 101 includes a pixel circuit. The pixel circuit includes a light-emitting element, a plurality of TFTs, and a capacitor in the case of an electroluminescent display. The pixel circuit is connected to a data line DL and a gate line GL. In FIG. 1, "D1 to D3" indicated in a circle are data lines, and "Gn–2 to Gn" indicated in the circle are gate lines. Here, n can be a positive integer.

Touch sensors can be disposed on the display panel 100. Touch input can be sensed using separate touch sensors or can be sensed through pixels. The touch sensors can be disposed on a screen of the display panel as on-cell type or add-on type touch sensors or can be implemented as in-cell type touch sensors embedded in the pixel array.

A display panel driving circuit for driving the display panel 100 includes a data driving circuit 110 and a gate driving circuit 120. The display panel driving circuit writes data of an input image to pixels of the display panel 100 under control of a timing controller (TCON) 130.

The data driving circuit 110 converts digital data VDATA, which is pixel data of an input image received from the timing controller 130 at each frame, into a gamma compensation voltage, and outputs a data signal. The data driving circuit 110 supplies a voltage of the data signal (hereinafter, a "data voltage") to the data lines DL. The data driving circuit 110 outputs a data voltage using a digital-to-analog converter (hereinafter referred to as "DAC") that converts digital data VDATA into a gamma compensation voltage.

The gate driving circuit 120 can be implemented as a GIP circuit directly formed on a substrate of the display panel 100 together with the pixel array disposed in the active area AA of the display panel 100. The GIP circuit can be disposed in a bezel area of the display panel 100 outside the active area AA.

The gate driving circuit 120 can be formed in a bezel area BZ in which an image is not displayed on the display panel 100.

The gate driving circuit 120 outputs a gate signal (scan pulse) under control of the timing controller 130 to select pixels charged with a data voltage through the gate lines GL. The gate driving circuit 120 outputs a gate signal (scan pulse) using one or more shift registers and shifts the gate signal. The gate driving circuit 120 shifts a first gate signal supplied to the gate lines at certain shift timing up to a predetermined specific gate line within a vertical active period, and then temporarily holds a voltage of the specific gate line in response to a line control signal. Subsequently, the gate driving circuit 120 supplies a second gate signal to the specific gate line, and then shifts the first gate signal supplied to the remaining gate lines at a certain shift timing. Accordingly, within the vertical active period, first and second gate signals are applied only to the specific gate line with a predetermined holding time interposed therebetween, and one gate signal is applied to each of the remaining gate lines.

The timing controller 130 receives pixel data of an input image and a timing signal synchronized with the pixel data from a host system. The pixel data of the input image received by the timing controller 130 is digital data. The timing signal includes a vertical synchronization signal Vsync, a horizontal synchronization signal Hsync, a clock signal DCLK, a data enable signal DE, etc. Since a vertical period and a horizontal period can be known by counting the data enable signal DE, the vertical synchronization signal Vsync and the horizontal synchronization signal Hsync can be omitted.

The host system can be any one of a television (TV), a set-top box, a navigation system, a personal computer (PC), a home theater, a mobile device, and a wearable device. In the mobile device and the wearable device, the data driving circuit 110, the timing controller 130, a level shifter 140, etc. can be integrated into one drive IC.

The timing controller 130 can multiply an input frame frequency by i to control the operation timing of the display panel driving circuits 110 and 120 with a frame frequency of input frame frequency×i (i being a positive integer greater than 0) Hz. The input frame frequency is 60 Hz in a national television standards committee (NTSC) scheme and 50 Hz in a phase-alternating line (PAL) scheme.

The timing controller 130 can lower the driving frequency of the display panel driving circuits 110 and 120 in a low-speed driving mode. For example, the timing controller 130 can lower the driving frequency of the display panel driving circuit to a level of 1 Hz so that data is written to the pixels once per second. The frequency of the low-speed driving mode is not limited to 1 Hz. Accordingly, the pixels of the display panel 100 can maintain a data voltage, with which the pixels are previously charged, without being charged with a new data voltage for most of the time in the low-speed driving mode.

The timing controller 130 generates a data timing control signal DDC for controlling the operation timing of the data driving circuit 110 and a gate timing control signal GDC for controlling the operation timing of the gate driving circuit 120 based on a timing signal received from the host system.

The level shifter 140 converts a high-level voltage of the gate timing control signal GDC output from the timing controller 130 into a gate-on voltage, converts a low-level voltage of the gate timing control signal GDC into a gate-off voltage, and supplies the voltages to the gate driving circuit 120. In the case of an n-channel TFT (NMOS), the gate-on voltage can be a gate-high voltage VGH, and the gate-off voltage can be a gate-low voltage VGL. In the case of a p-channel TFT (PMOS), the gate-on voltage can be a gate-low voltage VGL, and the gate-off voltage can be a gate-high voltage VGH. Hereinafter, a high-potential power voltage Vdd can be interpreted as a gate-on voltage. A low-potential power voltage Vss can be set to a voltage lower than the high-potential power voltage Vdd. The low-potential power voltage Vss can be interpreted as a gate-off voltage.

The gate timing control signal GDC includes a gate start pulse VST, a line select pulse LSP, a carry clock signal CRCLK, a scan clock signal SCCLK, etc. The gate start pulse VST is generated once at the beginning of a frame period in every frame period and is input to the gate driving circuit 120.

The gate start pulse VST controls the start timing of the gate driving circuit 120 in every frame period. The carry clock signal CRCLK and the scan clock signal SCCLK control shift timing of a carry pulse and a scan pulse output from the gate driving circuit 120.

Figure 2:
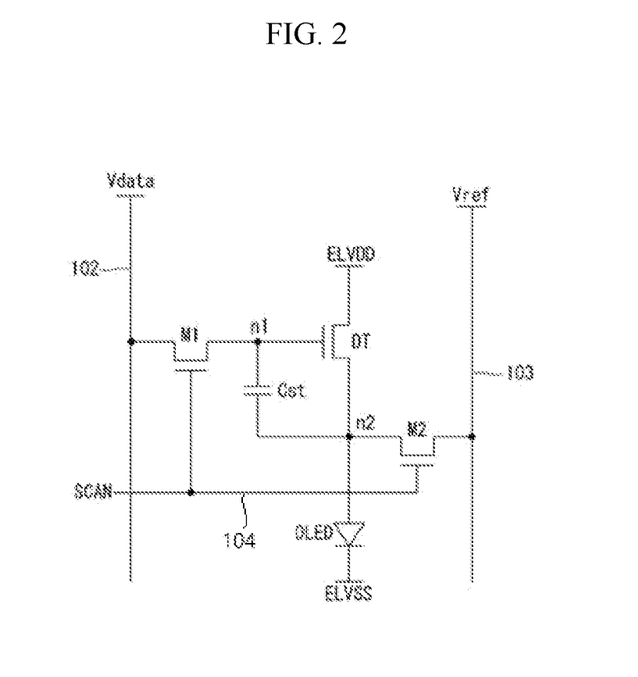
FIG. 2 is a circuit configuration diagram of one subpixel of a display panel 100.

FIG. 2 is a circuit configuration diagram of one subpixel of the display panel 100. Each subpixel of the display panel 100 can have the circuit configuration of FIG. 2.

As in the example of FIG. 2, the subpixel includes a light-emitting element OLED, a driving element DT connected to the light-emitting element OLED, a plurality of switch elements M1 and M2, and a capacitor Cst. The driving element DT and the switch elements M1 and M2 can be implemented as n-channel transistors NMOS. However, the present invention is not limited thereto.

The light-emitting element OLED emits light with a current generated according to a gate-source voltage Vgs of the driving element DT that varies according to a data voltage Vdata. The light-emitting element OLED includes an organic compound layer formed between an anode and a cathode. The organic compound layer can include, but is not limited to, a hole injection layer HIL, a hole transport layer HTL, an emission layer EML, an electron transport layer ETL, an electron injection layer EIL, etc. However, the present invention is not limited thereto. The anode of the light-emitting element OLED is connected to the driving element DT through a second node n2, and the cathode of the light-emitting element OLED is connected to an ELVSS electrode to which a low-potential power voltage ELVSS is applied.

The first switch element M1 is turned on according to a gate-on voltage of a scan signal SCAN to connect a data line 102 to a first node n1, thereby supplying the data voltage Vdata to the first node n1. The first switch element M1 includes a gate electrode connected to a gate line 104 to which the scan signal SCAN is applied, a first electrode connected to the data line 102, and a second electrode connected to the first node n1. A gate electrode of the driving element DT, a first electrode of the capacitor Cst, and a second electrode of the first switch element M1 are connected to the first node n1.

The second switch element M2 is turned on according to the gate-on voltage of the scan signal SCAN to supply a reference voltage Vref to the second node n2. The second switch element M2 includes a gate electrode connected to the gate line 104 to which the scan signal SCAN is applied, a first electrode connected to the second node n2, and a second electrode connected to a sensing line 103 to which the reference voltage Vref is applied. The second electrode of the driving element DT, the second electrode of the capacitor Cst, and the first electrode of the second switch element M2 are connected to the second node n2.

The driving element DT drives the light-emitting element OLED by supplying a current to the light-emitting element OLED according to the gate-source voltage Vgs. The driving element DT includes a gate electrode connected to the first node n1, a first electrode connected to an ELVDD line to which a pixel driving voltage ELVDD is supplied, and a second electrode connected to the second node n2. In FIG. 2, a gate voltage of the driving element DT is a voltage of the first node n1, and a source voltage of the driving element DT is a voltage of the second node n2.

The capacitor Cst is connected between the first node n1 and the second node n2 to maintain the gate-source voltage Vgs of the driving device DT for one frame.

Figure 3:
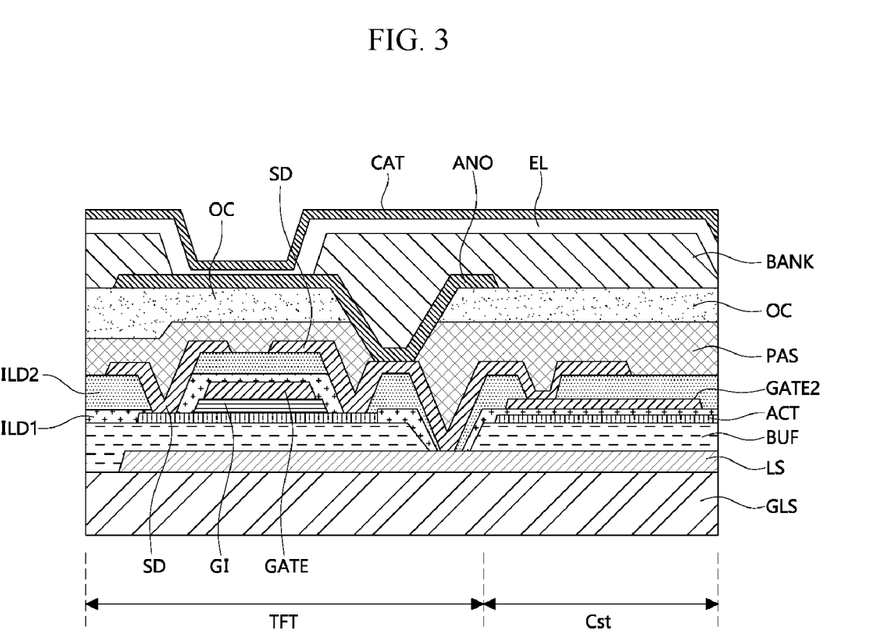
FIG. 3 is a cross-sectional view of one subpixel of the display panel according to an embodiment of the present invention.

FIG. 3 is a cross-sectional view of one subpixel of the display panel 100 according to an embodiment of the present invention. Each subpixel of the display panel 100 can have the configuration of FIG. 3.

In FIG. 3, configurations of the light-emitting element OLED, the driving element DT, and the capacitor Cst of FIG. 2 are illustrated. A pixel structure of FIG. 3 is an example of a top emission pixel structure in which light is emitted to the opposite side from a substrate GLS, for example, upward. Accordingly, the subpixel structure of the present invention is not limited to FIG. 3. FIG. 3 is divided into a TFT part and a capacitor Cst part.

As illustrated in FIG. 3, a first metal pattern LS is formed on the substrate GLS. The first metal pattern LS is disposed under a TFT to block light emitted to the TFT. Here, the TFT represents the driving element DT illustrated in FIG. 2.

A buffer layer BUF is formed of an inorganic insulating material, for example, $SiO_2$ or SiNx, and covers the first metal pattern LS.

An active pattern ACT of the TFT includes a semiconductor channel layer of the TFT. A portion of the active pattern ACT can be used as a lower electrode of the capacitor Cst. When the TFT is implemented as an oxide TFT, the active pattern ACT can include indium gallium zinc oxide (IGZO).

The active pattern ACT in the capacitor Cst part includes a lower electrode of the capacitor Cst.

A gate insulating layer GI is formed on the active pattern ACT in the TFT part. The gate insulating layer GI can be formed of an inorganic insulating material.

First and second interlayer insulating layers ILD1 and IDD2 are disposed between a third metal pattern GATE and a fourth metal pattern SD to insulate between these metal patterns.

A second metal pattern GATE2 is formed on the first interlayer insulating layer ILD1 in the capacitor Cst part. The second metal pattern GATE2 includes an upper electrode of the capacitor Cst.

The third metal pattern GATE disposed in the TFT part includes a gate electrode of the TFT.

The fourth metal pattern SD includes a source electrode and a drain electrode of the TFT.

The source electrode and the drain electrode of the TFT are electrically connected to the active pattern ACT through contact holes penetrating the first and second interlayer insulating layers ILD1 and ILD2. In the capacitor Cst part, the fourth metal pattern SD is electrically connected to the second metal pattern GATE2 through contact holes penetrating the second interlayer insulating layer ILD2.

The protective layer PAS covers the TFT part and the capacitor Cst part. The protective layer PAS can be formed of an inorganic insulating material.

A planarization layer OC covers the protective layer PAS to flatten a surface. The planarization layer OC can be formed of an organic insulating material.

An anode ANO of the light-emitting element OLED is disposed on the planarization layer OC to come into contact with the fourth metal pattern of the TFT through a contact hole penetrating the protective layer PAS and the planarization layer OC. The anode ANO can include a metal material.

A bank pattern BANK is formed of an organic insulating material and is disposed on a part of the anode ANO and the planarization layer OC to define a light-emitting area.

An organic compound layer EL of the light-emitting element OLED is disposed in an exposed area of the anode defined by the bank pattern BANK, and is disposed on the bank pattern BANK.

A cathode CAT of the light-emitting element OLED is disposed on the organic compound layer EL. The cathode can include a transparent metal electrode material such as indium zinc oxide (IZO).

Figure 4:
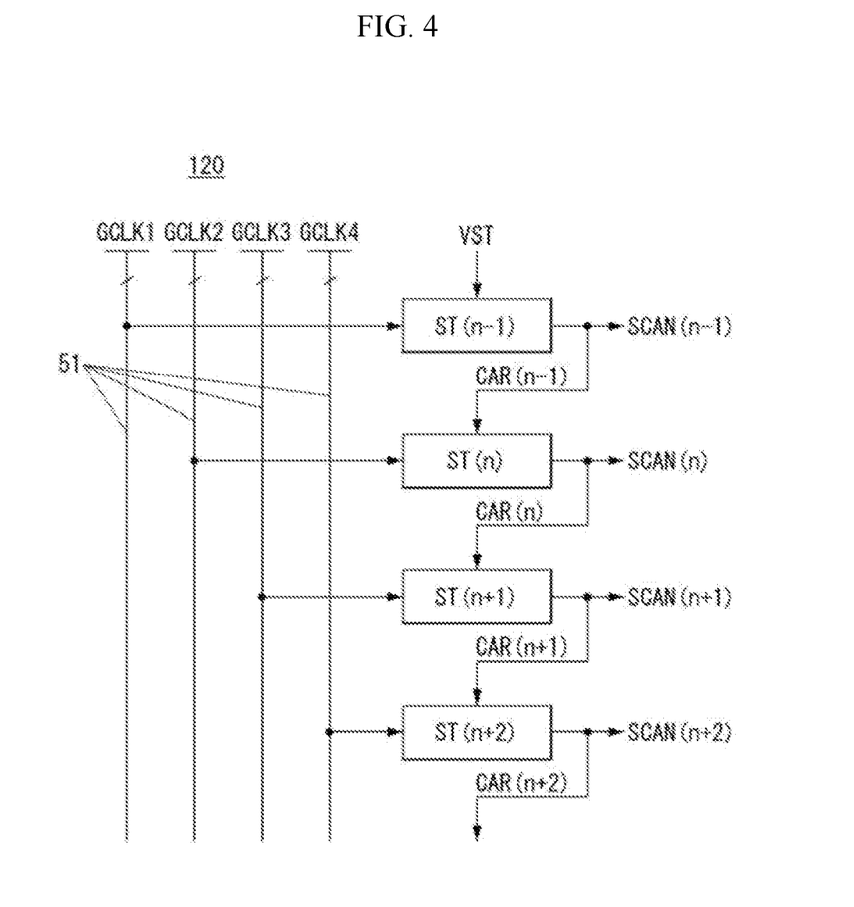
FIG. 4 is a block configuration diagram of a shift register in a gate driving circuit according to an embodiment of the present invention.

Meanwhile, FIG. 4 is a diagram schematically showing a circuit configuration of a shift register in the gate driving circuit.

Referring to FIG. 4, the shift register of the gate driving circuit 120 includes a plurality of stages SR(N−1) to SR(N+2) subordinately connected through wires. The shift register receives the gate start pulse VST or a carry signal output from a previous stage as a start pulse, and synchronizes with rising edges of the shift clocks GCLK1 to GCLK4 to output scan signals SCAN(n−1)) to SCAN(n+2) and carry signals CAR(n−1) to CAR(n+2). The shift clocks GCLK1 to GCLK4 are input to the stages ST(n−1) to ST(n+2) through clock lines 51.

Each of the stages ST(n−1) to ST(n+2) includes a first control node Q for controlling a pull-up transistor, and a second control node QB for controlling a pull-down transistor. The first control node Q is floated in a charged state according to the gate start pulse VST or the carry signals CAR(n−1) to CAR(n+2) from the previous stage. When the shift clocks GCLK1 to GCLK4 are applied to the pull-up transistor while the first control node is floated, a voltage of the first control node is boosted to a voltage VGH+a higher than a gate-on voltage VGH by bootstrapping to turn on the pull-up transistor Tup. In this instance, voltages of the scan signals SCAN(n−1) to SCAN(n+2) rise to the gate-on voltage VGH. The pull-down transistor is turned on when the second control node QB is charged, and decreases the voltages of the scan signals SCAN(n−1) to SCAN(n+2) to a gate-off voltage VGL. A reset signal can be applied from a subsequent stage.

Figure 5:
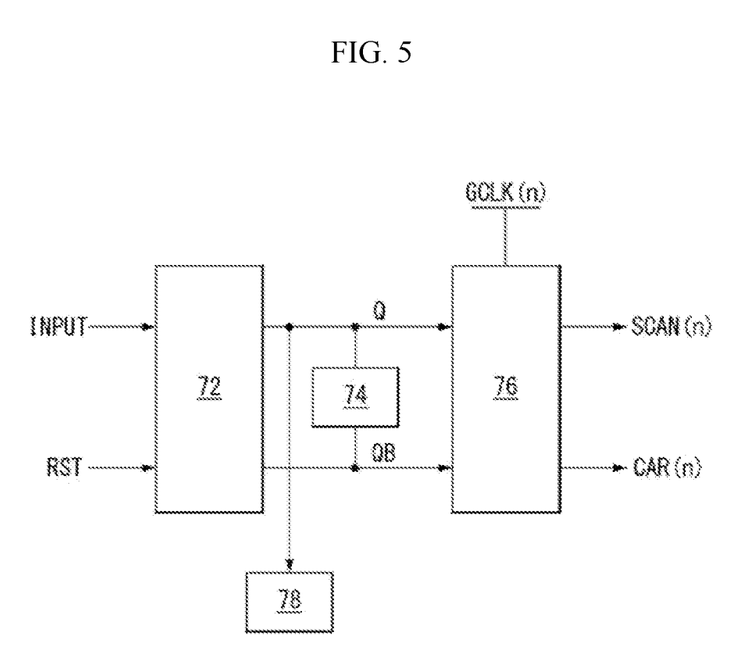
FIG. 5 is a block configuration diagram of an nth stage ST(n) according to an embodiment of the present invention.

FIG. 5 is a block diagram schematically illustrating a configuration of an nth stage ST(n).

Referring to FIG. 5, the nth can be divided into first to fourth circuit units 72 to 78 as illustrated in FIG. 5.

The first circuit unit 72 charges the first control node Q with a voltage of an input signal INPUT, and discharges the first control node Q with a voltage of a reset signal RST. The input signal INPUT can be a gate start pulse or a carry signal CAR(n−1) from a previous stage. The reset signal RST can be a carry signal CAR(n+1) output from a subsequent stage.

The second circuit unit 74 discharges the second control node QB when the first control node Q is charged with a voltage using an inverter circuit.

The third circuit unit 76 outputs a carry signal CAR(n) and a scan signal SCAN(n) using the pull-up transistor and the pull-down transistor.

The fourth circuit unit 78 connects the first control node Q to a node GVSS2 to perform a control operation so that the first control node Q does not float, and connects the second control node QB to the node GVSS2 according to the input signal INPUT.

Figure 6:
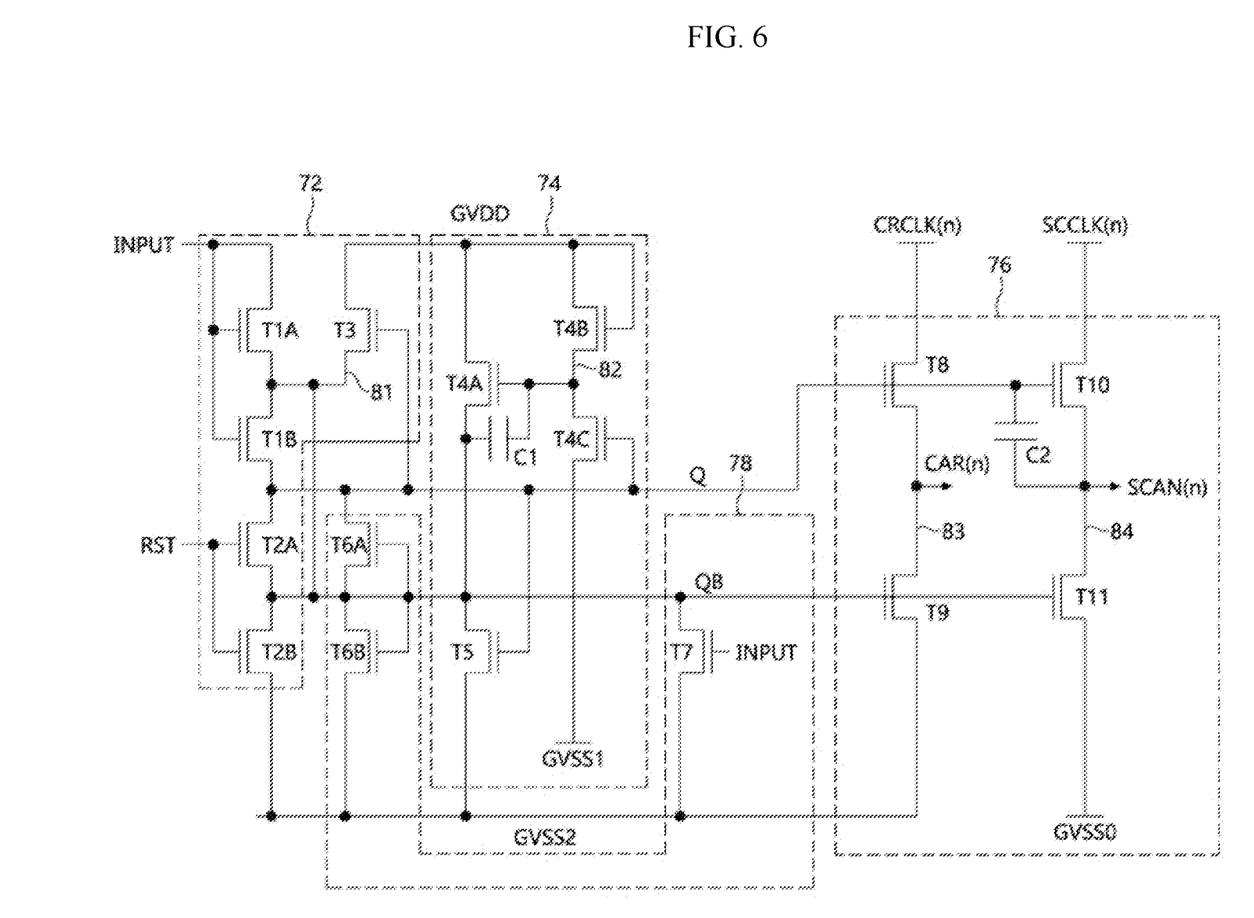
FIG. 6 is a detailed circuit diagram of an example of the nth stage ST(n) according to an embodiment of the present invention.

FIG. 6 is a detailed circuit diagram specifically illustrating an example of the nth stage ST(n) according to an embodiment of the present invention. Since FIG. 6 illustrates an example of a stage, a configuration of the stage is not limited to a circuit illustrated in FIG. 6.

Referring to FIG. 6, DC power voltages such as GVDD and GVSS0 to GVSS2 are supplied to the nth stage ST(n). The input signal INPUT, the reset signal RST, a shift clock CRCLK(n) for a carry signal, and a shift clock SCCLK(n) for a scan signal are input to the nth stage ST(n).

GVDD is a high-potential power voltage higher than GVSS0 to GVSS2. Voltages of GVSS0 to GVSSS2 can be set to GVSS2<GVSS0 so that a tenth transistor T10 can be turned off under a negative bias condition, and can be set to GVSS2<GVSS1 so that a fourth-C transistor T4C can be completely turned off when the second control node QB is charged with a high voltage. Voltages of GVSS1 and GVSS0 can be set as GVSS1=GVSS0.

The shift clock CRCLK(n) for the carry signal and the shift clock SCCLK(n) for the scan signal swing between the gate-on voltage VGH and the gate-off voltage VGL and are generated as clocks of the same phase.

The first circuit unit 72 charges (pre-charges) the first control node Q by supplying the voltage of the input signal INPUT to the first control node Q when the input signal INPUT has a voltage equal to or greater than the gate-on voltage VGH. The first circuit unit 72 includes first-A and first-B transistors T1A and T1B and second-A and second-B transistors T2A and T2B. The input signal can be the carry signal CAR(n−1) from the previous stage, as illustrated in FIG. 6.

The first-A transistor T1A is turned on when the input signal INPUT has a high voltage equal to or greater than the gate-on voltage VGH, and supplies the voltage of the input signal INPUT to the first node 81. The first-A transistor T1A includes a gate electrode and a first electrode to which the input signal INPUT is applied, and a second electrode connected to the first node 81.

The first-B transistor T1B is turned on when the input signal INPUT has a voltage greater than or equal to the gate-on voltage VGH, and supplies the voltage of the first node 81 to the first control node Q to charge the first control node Q. The first-B transistor T1B includes a gate electrode to which the input signal INPUT is applied, a first electrode connected to the first node 81, and a second electrode connected to the first control node Q.

When the voltage of the carry signal C(n−1) is the gate-low voltage VGL in a state in which the first control node Q is charged with a voltage, a voltage of the first node 81 between the first-A and first-B transistors T1A and T1B is GVDD.

The second-A and second-B transistors T2A and T2B are turned on when the reset signal RST is a high voltage equal to or higher than the gate-on voltage VGH, and connect the first control node Q to a node GVSS2, and discharge the first control node Q up to GVSS2. The second-A transistor T2A includes a gate electrode to which the reset signal RST is applied, a first electrode connected to the first control node Q, and a second electrode connected to the first node 81. The second-B transistor T2B includes a gate electrode to which the reset signal RST is applied, a first electrode connected to the first node 81, and a second electrode connected to the node GVSS2.

The first circuit unit 72 can further include a third transistor T3.

The third transistor T3 is turned on when the first control node Q is charged with a voltage greater than or equal to the gate-on voltage VGH, connects a node GVDD to the first node 81, and charges the first node 81 with GVDD to compensate for current leakage of the first node 81. The third transistor T3 includes a gate electrode connected to the first control node Q, a first electrode connected to the node GVDD, and a second electrode connected to the first node 81.

The second circuit unit 74 includes an inverter circuit that discharges the second control node QB up to a voltage of GVSS2 during a charging period in which the voltage of the first control node Q is boosted to a voltage equal to or greater than the gate-on voltage VGH. The second circuit unit 72 includes fourth-A to fourth-C transistors T4A, T4B, and T4C and a fifth transistor T5.

The fourth-A transistor T4A is turned on when the voltage of the second node 82 is the gate-on voltage VGH, and connects the node GVDD to the second control node QB, thereby charging the second control node QB with GVDD. The fourth-A transistor T4A includes a gate electrode connected to the second node 82, a first electrode connected to the node GVDD, and a second electrode connected to the second control node QB. A first capacitor C1 is connected between the gate electrode and the second electrode of the fourth-A transistor T4A. When the fourth-A transistor T4A is turned on by the first capacitor C1, the voltage of the second node 82 can be boosted.

The fourth-B transistor T4B operates as a diode turned on by GVDD. The fourth-B transistor T4B supplies GVDD to the second node 82 to charge the second node 82. The fourth-B transistor T4B includes a gate electrode and a first electrode connected to the node GVDD, and a second electrode connected to the second node 82.

The fourth-C transistor T4C is turned on when the first control node Q is charged with a voltage equal to or higher than the gate-on voltage VGH, connects the second node 82 to a node GVSS1, and discharges the second node 82 up to GVSS1. In this instance, the voltage of the second control node QB is maintained at GVSS2 by the fifth transistor T5. The fourth-C transistor T4C includes a gate electrode connected to the first control node Q, a first electrode connected to the second node 82, and a second electrode connected to the node GVSS1.

The fifth transistor T5 is turned on when the voltage of the first control node Q is a high voltage greater than or equal to the gate-on voltage, connects the second control node QB to the node GVSS2, and discharges the second control node QB up to a voltage of GVSS2. The fifth transistor T5 includes a gate electrode connected to the first control node Q, a first electrode connected to the second control node QB, and a second electrode connected to the node GVSS2.

The third circuit unit 76 includes first and second pull-up transistors T8 and T10 and first and second pull-down transistors T9 and T11.

The first pull-up transistor T8 is turned on when the voltage of the first control node Q is equal to or greater than the gate-on voltage VGH, and connects a first clock line, to which the shift clock CRCLK(n) is applied, to the first output node 83. In this instance, the first output node 83 is charged with the gate-on voltage VGH of the shift clock CRCLK(n), so that a pulse of the carry signal CAR(n) rises. The first pull-up transistor T8 includes a gate electrode connected to the first control node Q, a first electrode connected to the first clock line, and a second electrode connected to the first output node 83.

The first pull-down transistor T9 is turned on when the voltage of the second control node QB is a high voltage equal to or higher than the gate-on voltage VGH, connects the first output node 83 to the node GVSS2, and discharges the first output node 83 up to GVSS2. When the first pull-down transistor T9 is turned on, the voltage of the carry signal CAR(n) is lowered to the gate-off voltage VGL. The first pull-down transistor T9 includes a gate electrode connected to the second control node QB, a first electrode connected to the first output node 83, and a second electrode connected to the node GVSS2.

The second pull-up transistor T10 is turned on when the voltage of the first control node Q is equal to or greater than the gate-on voltage VGH, connects a second clock line, to which the shift clock SCCLK(n) is applied, to an output node 84, and charges the second output node 75. When the second pull-up transistor T10 is turned on, the voltage of the scan signal SCAN(n) increases to the gate-on voltage VGH. The second pull-up transistor T10 includes a gate electrode connected to the first control node Q, a first electrode connected to the second clock line, and a second electrode connected to the second output node 84.

The third circuit unit 76 can further include a second capacitor C2. The second capacitor C2 can be connected between the first control node Q and the second output node 84. When the eighth transistor T8 is turned on, the voltage of the second output node 84 increases, and the voltage of the first control node Q coupled to the capacitor C2 and the second output node 83 can be boosted.

The second pull-down transistor T11 is turned on when the voltage of the second control node QB is equal to or higher than the gate-on voltage VGH, connects the second output node 84 to a node GVSS0, and discharges the second output node 84 up to a voltage of GVSS0. When the second pull-down transistor T11 is turned on, the voltage of SCAN(n) is lowered to GVSS0 at a falling edge of the scan signal SCAN(n). The second pull-down transistor T11 includes a gate electrode connected to the second control node QB, a first electrode connected to the second output node 84, and a second electrode connected to the node GVSS0.

The fourth circuit unit 78 includes sixth-A and sixth-B transistors T6A and T6B and a seventh transistor T7.

The sixth-A and sixth-B transistors T6A and T6B are turned on when the voltage of the second control node QB is greater than or equal to the gate-on voltage VGH, connects the first control node Q to the node GVSS2, and discharges the first control node Q up to GVSS2. The sixth-A transistor T6A includes a gate electrode connected to the second control node QB, a first electrode connected to the first control node Q, and a second electrode connected to the first node 81. The sixth-B transistor T6B includes a gate electrode connected to the second control node QB, a first electrode connected to the first node 81, and a second electrode connected to the node GVSS2.

The seventh transistor T7 is turned on when the voltage of the input signal INPUT is the gate-on voltage VGH, connects the second control node QB to the node GVSS2, and discharges the second control node QB up to a voltage of GVSS2. The seventh transistor T7 includes a gate electrode to which the input signal INPUT is applied, a first electrode connected to the second control node QB, and a second electrode connected to the node GVSS2.

As mentioned above, the gate driving circuit 120 can be directly formed in the bezel area of the display panel 100 together with the pixel array disposed in the active area AA of the display panel 100. Hereinafter, the gate driving circuit 120 directly formed on the substrate of the display panel 100 will be referred to as a "GIP circuit".

As described with reference to FIGS. 4 to 6, in order to drive the GIP circuit, the low-potential power voltages GVSS0, GVSS1, and GVSS2, the high-potential power voltage GVDD, and shift clock (CRCLK(n) and SCCLK(n)) signals are needed.

Accordingly, when the GIP circuit is directly disposed in the bezel area, a low-potential power voltage (GVSS0, GVSS1, and GVSS2) supply line, a high-potential power voltage (GVDD) supply line, and a shift clock (CRCLK(n) and SCCLK(n)) signal supply line, etc. for supplying the low-potential power voltages GVSS0, GVSS1, and GVSS2, the high-potential power voltage GVDD, and the shift clock (CRCLK(n) and SCCLK(n)) signals need to be disposed in the bezel area.

Figure 7:
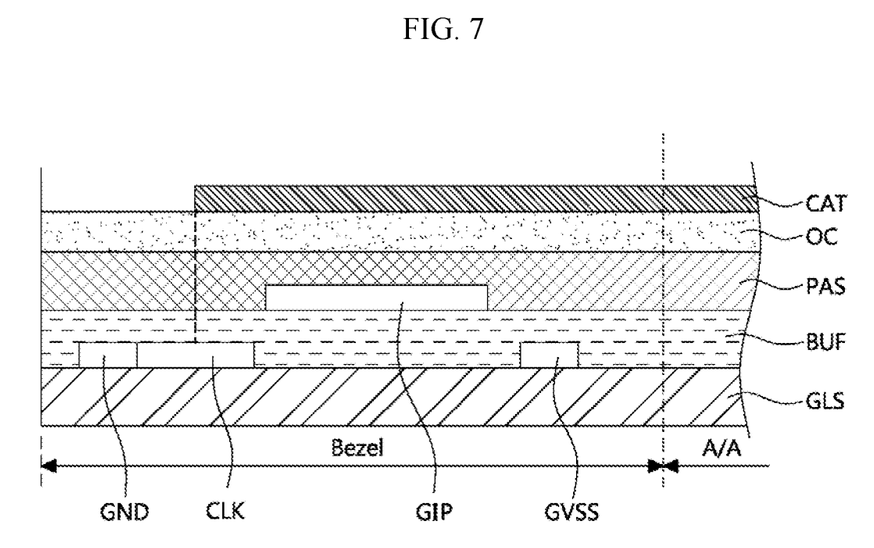
FIG. 7 is a schematic structural cross-sectional view of a bezel area of a display panel according to a comparative example of the present invention.

FIG. 7 is a schematic structural cross-sectional view of a bezel area of a display panel according to a comparative example of the present invention.

As illustrated in FIG. 7, the bezel area of the display panel includes a ground area GND in which a ground line is disposed, a clock line area CLKS in which shift clock (CRCLK(n) and SCCLK(n)) lines are disposed, a GIP circuit area GIP in which the gate driving circuit 120 is disposed, a low-voltage line area GVSS in which a low-voltage supply line is disposed, etc.

The ground line, the shift clock (CRCLK(n) and SCCLK(n)) lines, the low-voltage supply line, etc. are formed of the same material as that of the first metal pattern LS illustrated in FIG. 3, and thus the ground area GND, the clock line area CLKS, and the low-voltage line area GVSS are disposed on the substrate GLS.

A buffer layer BUF covers the ground area GND, the clock line area CLKS, and the low-voltage line area GVSS in the bezel area BZ. The buffer layer BUF is the same layer as the buffer layer BUF of FIG. 3.

Since the gate driving circuit 120 is simultaneously formed when the TFT and the capacitor Cst are formed in a subpixel area, the GIP circuit area GIP is disposed on the buffer layer BUF in the bezel area.

The protective layer PAS and the planarization layer OC in the subpixel area illustrated in FIG. 3 cover the GIP circuit area GIP in the bezel area.

The cathode CAT formed in the subpixel area illustrated in FIG. 3 extends from the planarization layer OC to a predetermined portion of the bezel area.

Here, as illustrated in FIG. 7, in the display panel of the comparative example of the present invention, in the bezel area, in a direction from an edge of the display panel to the active area AA, the ground area GND, the clock line area CLKS, the GIP circuit area GIP, and the low-voltage line area GVSS are disposed in this order.

In addition, when the bezel area is reduced to achieve a narrow bezel, a proportion of a cathode CAT mask area increases, and the cathode CAT overlaps a part of the clock line area CLKS.

For example, in the display panel of the comparative example of the present invention, as illustrated in FIG. 7, some shift clock (CRCLK(n) and the SCCLK(n)) lines among shift clock (CRCLK(n) and the SCCLK(n)) lines disposed in the clock line area CLKS overlap the cathode CAT, and a parasitic capacitance is generated between the cathode CAT and some shift clock (CRCLK(n) and the SCCLK(n)) lines overlapping the cathode CAT.

Accordingly, due to the parasitic capacitance, an output deviation occurs between some shift clock (CRCLK(n) and the SCCLK(n)) lines overlapping the cathode CAT and some shift clock (CRCLK(n) and the SCCLK(n)) lines not overlapping the cathode CAT.

The display panel according to the embodiment of the present invention can resolve the output deviation between the shift clock (CRCLK(n) and the SCCLK(n)) lines by changing the arrangement order of the ground area GND, the clock line area CLKS, the GIP circuit area GIP, and the low-voltage line area GVSS disposed in the bezel area.

Figure 8:
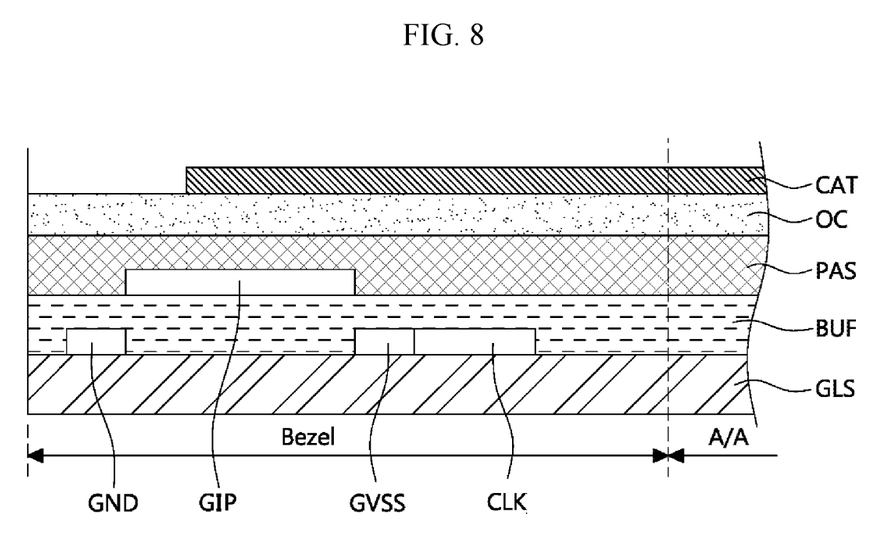
FIG. 8 is a schematic structural cross-sectional view of a bezel area of the display panel according to an embodiment of the present invention.

FIG. 8 is a schematic structural cross-sectional view of a bezel area of a display panel according to an embodiment of the present invention.

As illustrated in FIG. 8, the bezel area of the display panel includes a ground area GND in which a ground line is disposed, a clock line area CLKS in which shift clock (CRCLK(n) and SCCLK(n)) lines are disposed, a GIP circuit area GIP in which the gate driving circuit 120 is disposed, a low-voltage line area GVSS in which a low-voltage supply line is disposed, etc.

The ground line, the shift clock (CRCLK(n) and SCCLK(n)) lines, the low-voltage supply line, etc. can be formed of the same material as that of the first metal pattern LS illustrated in FIG. 3. The ground area GND, the clock line area CLKS, and the low-voltage line area GVSS are disposed on the substrate GLS.

A buffer layer BUF covers the ground area GND, the clock line area CLKS, and the low-voltage line area GVSS in the bezel area BZ. The buffer layer BUF is the same layer as the buffer layer BUF of FIG. 3.

Since the gate driving circuit 120 is simultaneously formed when the TFT and the capacitor Cst are formed in a subpixel area, the GIP circuit area GIP is disposed on the buffer layer BUF in the bezel area.

The protective layer PAS and the planarization layer OC in the subpixel area illustrated in FIG. 3 cover the GIP circuit area GIP in the bezel area.

The cathode CAT formed in the subpixel area illustrated in FIG. 3 extends from the planarization layer OC to a predetermined portion of the bezel area.

As illustrated in FIG. 8, in the display panel of the embodiment of the present invention, in the bezel area, in a direction from an edge of the display panel to the active area AA, the ground area GND, the GIP circuit area GIP, the low-voltage line area GVSS and the clock line area CLKS are arranged in this order.

The bezel area is reduced to achieve a narrow bezel, and even when a proportion of a cathode CAT mask area increases, all shift clock (CRCLK(n) and SCCLK(n)) lines disposed in the clock line area CLKS overlap the cathode CAT.

Accordingly, the same parasitic capacitance is generated between each of all the shift clock (CRCLK(n) and SCCLK(n)) lines disposed in the clock line area CLKS and the cathode CAT, and thus no output deviation occurs between the shift clock (CRCLK(n) and SCCLK(n)) lines.

In addition, since the clock line area CLKS is disposed close to the active area, a freedom of arrangement of the shift clock (CRCLK(n) and SCCLK(n)) lines and a GIP circuit is increased, and thus it is possible to easily achieve a narrow bezel.

Meanwhile, in the description of the embodiment of the present invention, the ground line, the shift clock (CRCLK(n) and SCCLK(n)) lines, and the low-voltage supply line are made of the same material as that of the first metal pattern LS illustrated in FIG. 3. However, the present invention it is not limited thereto.

The ground line, the shift clock (CRCLK(n) and SCCLK(n)) lines, and the low-voltage supply line are made of the same material as that of the first metal pattern LS illustrated in FIG. 3, a plurality of contact holes is formed in an insulating film formed between a gate electrode (gate line) and the ground line, the shift clock (CRCLK(n) and SCCLK (n)) lines, and the low-voltage supply lines so that the lines are exposed in order to reduce the line resistance of the ground line, the shift clock (CRCLK(n) and SCCLK(n)) lines, and the low-voltage supply lines, and the contact holes are filed with the same metal material as that of the gate electrode (gate line). In this way, it is possible to form a double metal structure in which the first metal pattern LS and the metal material for the gate electrode (gate line) are stacked and electrically connected to each other.

The display panel according to one or more embodiments of the present invention having the above characteristics has the following effects.

According to one or more embodiments of the present invention, since the clock line area is disposed close to the active area so that all the shift clock lines disposed in the clock line area overlap the cathode, output deviation between the shift clock lines disposed in the bezel area can be eliminated.

In addition, since the freedom of arrangement of the shift clock lines and the GIP circuit is increased, it is possible to easily achieve the narrow bezel.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A display panel comprising:
   an active area configured to display an image; and
   a bezel area disposed around the active area,
   wherein a ground area, a clock line area, a gate-in-panel (GIP) circuit area, and a low-voltage line area are disposed in the bezel area,
   wherein a ground line is disposed in the ground area,
   wherein a low-voltage supply line is disposed in the low-voltage line area,
   wherein a first clock line carrying a first clock signal and a second clock line carrying a second clock signal different from the first clock signal are disposed in the clock line area,
   wherein the gate-in-panel circuit area includes a circuit comprising at least one transistor and one capacitor, and
   wherein the clock line area is disposed closest to the active area so the first clock line and the second clock line are closer to the active area than the ground line, the low-voltage supply line, and at least one transistor and one capacitor of the GIP circuit area.

2. The display panel according to claim 1, wherein the ground area, the gate-in-panel circuit area, the low-voltage line area, and the clock line area are sequentially disposed in a direction from an edge of the display panel to the active area.

3. The display panel according to claim 1, wherein the active area includes:
   a first metal pattern disposed on a substrate to block light;
   a buffer layer disposed on the substrate to cover the first metal pattern;
   a thin film transistor (TFT) and a capacitor disposed on the buffer layer;
   a protective layer and a planarization layer disposed on the substrate to cover the thin film transistor and the capacitor; and
   a light-emitting element disposed on the planarization layer, the light-emitting element including an anode, an organic compound layer, and a cathode, wherein:
   the cathode extends to a predetermined area of the bezel area, and
   all shift clock signal lines disposed in the clock line area overlap the cathode.

4. The display panel according to claim 3, wherein the ground line disposed in the ground area, the shift clock signal lines, and the low-voltage supply line disposed in the low-voltage line area are disposed on a same layer as a layer of the first metal pattern.

5. The display panel according to claim 4, wherein the ground line disposed in the ground area, the shift clock signal lines, and the low-voltage supply line disposed in the low-voltage line area are formed as a double metal structure in which the first metal pattern and a material of a gate electrode of the thin film transistor are stacked.

6. The display panel according to claim 3, wherein the gate-in-panel circuit area is disposed on a same layer as a layer of the thin film transistor and the capacitor.

7. A display device comprising:
   the display panel according to claim 1; and
   a display panel driving circuit configured to drive the display panel.

8. The display device according to claim 7, wherein the ground area, the gate-in-panel circuit area, the low-voltage line area, and the clock line area are sequentially disposed in a direction from an edge of the display panel to the active area.

9. The display device according to claim 7, wherein the active area includes:
   a first metal pattern disposed on a substrate to block light;
   a buffer layer disposed on the substrate to cover the first metal pattern;
   a thin film transistor (TFT) and a capacitor disposed on the buffer layer;
   a protective layer and a planarization layer disposed on the substrate to cover the thin film transistor and the capacitor; and
   a light-emitting element disposed on the planarization layer, the light-emitting element including an anode, an organic compound layer, and a cathode, wherein:
   the cathode extends to a predetermined area of the bezel area, and
   all shift clock signal lines disposed in the clock line area overlap the cathode.

10. The display device according to claim 9, wherein a ground line disposed in the ground area, the shift clock signal lines, and a low-voltage supply line disposed in the low-voltage line area are disposed on a same layer as a layer of the first metal pattern.

11. The display device according to claim 10, wherein the ground line disposed in the ground area, the shift clock signal lines, and the low-voltage supply line disposed in the low-voltage line area are formed as a double metal structure in which the first metal pattern and a material of a gate electrode of the thin film transistor are stacked.

12. The display device according to claim 9, wherein the gate-in-panel circuit area is disposed on a same layer as a layer of the thin film transistor and the capacitor.

* * * * *